United States Patent [19]
Lim

[11] Patent Number: 5,841,306
[45] Date of Patent: Nov. 24, 1998

[54] PULSE GENERATOR FOR GENERATING OUTPUT PULSE OF A PREDETERMINED WIDTH

[75] Inventor: Chang-Sik Lim, Suwon, Rep. of Korea

[73] Assignee: Samsung Electronics Co., Ltd., Kyungki-do, Rep. of Korea

[21] Appl. No.: 766,860

[22] Filed: Dec. 13, 1996

Related U.S. Application Data

[63] Continuation-in-part of Ser. No. 537,331, Oct. 2, 1995, abandoned, which is a continuation of Ser. No. 422,615, Apr. 13, 1995, abandoned, which is a continuation of Ser. No. 107,900, Aug. 18, 1993, abandoned.

[30] Foreign Application Priority Data

Aug. 18, 1992 [KR] Rep. of Korea ............... 92-14861

[51] Int. Cl.$^6$ .................................................. H03K 3/03
[52] U.S. Cl. ..................... 327/228; 327/175; 327/217; 327/225; 327/227
[58] Field of Search .................... 327/172, 175, 327/185, 215, 217, 225, 227, 228

[56] References Cited

U.S. PATENT DOCUMENTS

| | | | |
|---|---|---|---|
| 3,883,756 | 5/1975 | Dragon | 327/176 |
| 4,057,740 | 11/1977 | Arguello | 327/175 |
| 4,217,505 | 8/1980 | Aoki et al. | 327/176 |
| 4,277,697 | 7/1981 | Hall et al. | 327/175 |
| 4,620,312 | 10/1986 | Yamashita | 327/176 |
| 4,736,118 | 4/1988 | Fischer | 327/175 |

FOREIGN PATENT DOCUMENTS

| | | |
|---|---|---|
| 59-151520 | 8/1984 | Japan . |
| 60-80314 | 5/1985 | Japan . |
| 62-31215 | 2/1987 | Japan . |
| 2-60223 | 2/1990 | Japan . |
| 2-272820 | 11/1990 | Japan . |

*Primary Examiner*—Terry Cunningham
*Attorney, Agent, or Firm*—Cushman Darby&Cushman IP Group of Pillsbury Madison & Sutro LLP

[57] ABSTRACT

The bias control means determines the operating mode only when the trigger input comes into a valid state or the inverted output signal is low level, and determines the power saving mode in other cases. During the power saving mode, the comparator does not operate since a bias current is not supplied, therefore, the pulse generator of the present invention can attain a low power consumption. Also, the pulse generator of the present invention can generate an output signal having a desired width regardless of the width of the trigger input.

5 Claims, 4 Drawing Sheets

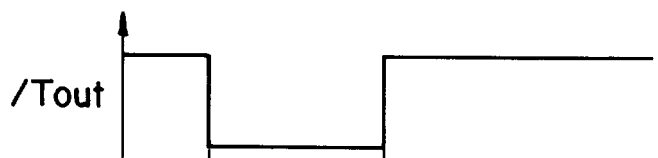
FIG. 5A  /Tout
FIG. 5B  Vtri
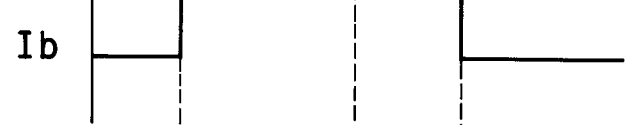
FIG. 5C  Ib
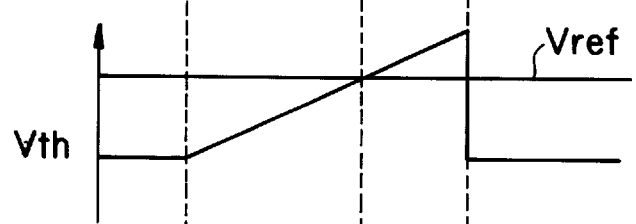
FIG. 5D  Vth  Vref
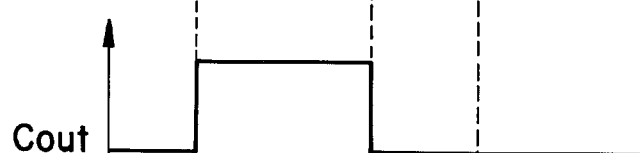
FIG. 5E  Cout
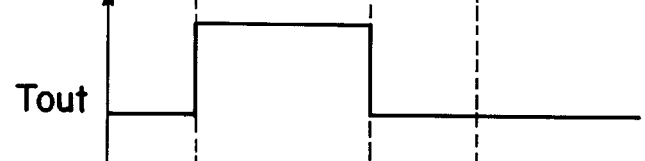
FIG. 5F  Tout
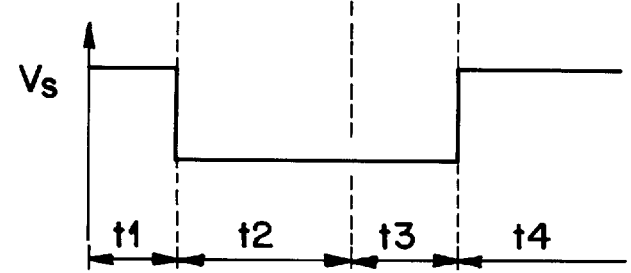
FIG. 5G  Vs
t1  t2  t3  t4

PULSE GENERATOR FOR GENERATING OUTPUT PULSE OF A PREDETERMINED WIDTH

This application is a Continuation-in-Part of Ser. No. 08/537,331 filed Oct. 2, 1995, now abandoned, which is a Continuation of Ser. No. 08/422,615 filed Apr. 13, 1995, now abandoned, which is a Continuation of Ser. No. 08/107,900 filed Aug. 18, 1993, now abandoned.

BACKGROUND OF THE INVENTION (1) Field of the Invention

The present invention relates to a pulse generator, and more particularly, to a circuit for generating one pulse signal having a predetermined pulse width in response to a trigger input signal.

(2) Description of the Related Art

A pulse generator or one shot timer is known as a circuit device for generating a pulse signal having a constant pulse width when a trigger is applied thereto. Such pulse generator circuits have been embodied in integrated circuit devices.

A conventional one shot timer circuit is illustrated by a schematic block diagram in FIG. 1.

This one shot timer contains first and second comparators 1 and 2 received by R and S input terminals respectively. A totem pole output stage 4 receives the output Q of the R/S latch 3. The inverted Q output of the R/S latch 3 is connected to the base of a bipolar junction transistor 5 for discharging the electric charge of an external capacitor Cx. The output of the totem pole output stage becomes the final output of the timer.

Resistor Rx and capacitor Cx are connected in series between a supply voltage Vcc and ground. A voltage Vth proportional to the time constant RxCx is produced at node N1 and applied to a non-inverted input terminal of comparator 1. Node N1 is also connected to the collector of transistor 5. Charge stored in the capacitor Cx is discharged to ground through the transistor 5 when transistor 5 is turned on.

First and second reference voltages V1 and V2 are produced from nodes N2 and N3, respectively, formed by three resistors R connected in series between the supply voltage Vcc and ground. The first reference voltage V1 is applied to the non-inverted input terminal of the second comparator 2, while an external trigger input signal Vtri is applied to its inverted input terminal. The second reference voltage V2 is applied to the inverted input terminal of the first comparator 1.

Referring to FIGS. 2A to 2C and 3A to 3C, operation of the timer of FIG. 1 will now be described in detail.

When the trigger input signal Vtri of FIG. 2A is applied to the inverted input terminal of the second comparator 2 for a Ti period, charge on capacitor Cx rises in a steady curve in proportion to the time constant of 1.1 RxCx, as illustrated in FIG. 2B. Then, as shown in FIG. 2C, the output pulse Vot appears for a period T0 when the reference voltage V2 of the inverted input terminal of the first comparator 1 is set to ⅔ Vcc. The period T0 of the output pulse Vot is designed to equal 1.1 RxCx.

When the pulse width Ti of the trigger input signal is always smaller than the period T0, it is possible to obtain the desired output pulse. Because R/S latch 3 uses a NOR gate, when both signals inputted to S and R input terminals are high level (T1 is larger than T0), the pulse width of the output pulse Vot is equal to the pulse width of the trigger input signal Vtri. FIGS. 3A to 3C illustrate this faulty operation and FIG. 3A shows the trigger input signal Vtri, FIG. 3B shows the threshold voltage Vth, and FIG. 3C shows the output pulse Vot.

SUMMARY OF THE INVENTION

The object of the present invention is to provide a pulse generator which generates a pulse signal having a desired width regardless of the width of a trigger input.

Another object of the present invention is to provide a pulse generator which attains a low power consumption by operating as a power saving mode in an absence of a trigger input.

To achieve the above objects, a pulse generator according to the present invention comprises:

bias control means for determining any one of a operating mode and power saving mode in accordance with a trigger input and an inverted output signal, providing the control voltage of high level as well as forming a first and second current paths in the operating mode, and providing the control voltage of low level as well as cutting off the two current paths in the power saving mode;

an RC circuit having a resistor and capacitor connected in series between a supply voltage and ground, wherein said RC circuit provides a threshold voltage through the node between the resistor and the capacitor;

voltage dividing means for dividing the supply voltage by a predetermined ratio, and outputting the divided voltage as a reference voltage;

charge control means for charging the capacitor of said RC circuit in response to the formation of the first current path, and discharging the capacitor in response to the cut-off of the first current path;

a comparator for comparing the threshold voltage with the reference voltage, to produce a predetermined output voltage in response to the result of the comparison, when the second current path is formed, and not operating when the second current path is cut off; and an AND gate for performing a logical AND function to the output voltage of said comparator and the control voltage of said bias control means, and providing the result of the AND function as an output signal.

In the pulse generator of the present invention, said bias control means determines the operating mode only when the trigger input comes into a valid state or the inverted output signal is low level. In other case, said bias control means determines the power saving mode. In the operating mode said comparator operates properly, in the power saving mode, however, said comparator does not operate since a bias current is not supplied to the comparator due to the cut-off of the second current path.

Therefore, the pulse generator of the present invention can attain a low power consumption since it does not operate in the power saving mode.

When the capacitor of said RC circuit is charged, each values of the resistor and capacitor determines time for the threshold voltage to reach the reference voltage. The time determines the pulse width of the output signal of said comparator, and the pulse width determines the pulse width of overall output signal of the pulse generator. Consequently, the pulse width of the overall output signal does not depend on the width of the trigger input.

Therefore, the pulse generator of the present invention can generate an output signal having a desired width regardless of the width of the trigger input.

The above and further objects, features and advantages of the present invention will become more apparent from the following detailed description of the preferred embodiment taken in conjunction with the accompanying drawings.

BRIEF DESCRIPTION OF THE DRAWINGS

FIGS. 5A to 5G show waveforms of signals implemented in the pulse generator of FIG. 4 when the pulse width of the trigger input is larger than that of the desired output signal; and, FIGS. 6A to 6G show waveforms of signals implemented in the pulse generator of FIG. 4 when the pulse width of the trigger input is smaller than that of the desired output signal.

DETAILED DESCRIPTION OF THE PREFERRED EMBODIMENTS

Figure 1:
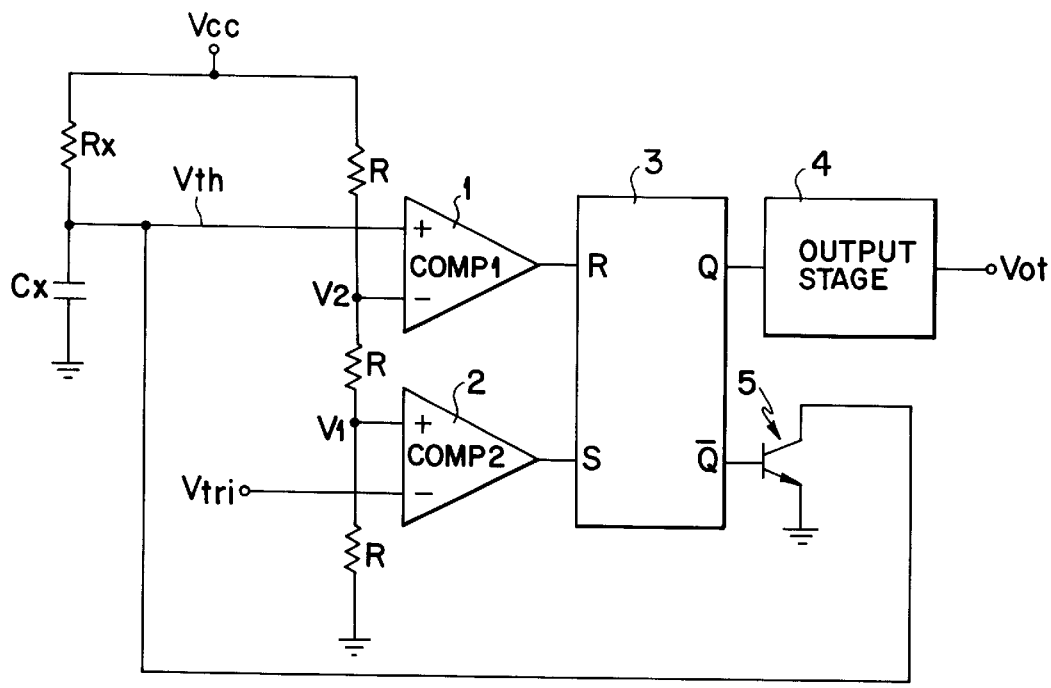
FIG. 1 shows a circuit diagram of a conventional prior art pulse generator.
Figure 2A:
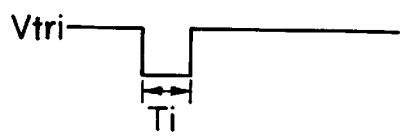
FIGS. 2A to 2C show waveforms of different signals of the pulse generator in FIG. 1 when the pulse width of a trigger input signal is smaller than that of a desired output pulse.
Figure 2B:
Figure 2C:
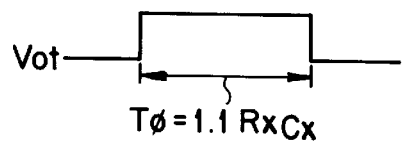
Figure 3A:
FIGS. 3A to 3C show waveforms of different signals of the pulse generator in FIG. 1 when the pulse width of the trigger input signal is larger than that of the desired output pulse.
Figure 3B:
Figure 3C:
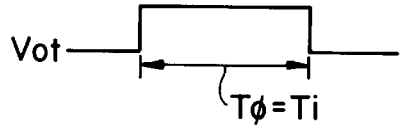
Figure 4:
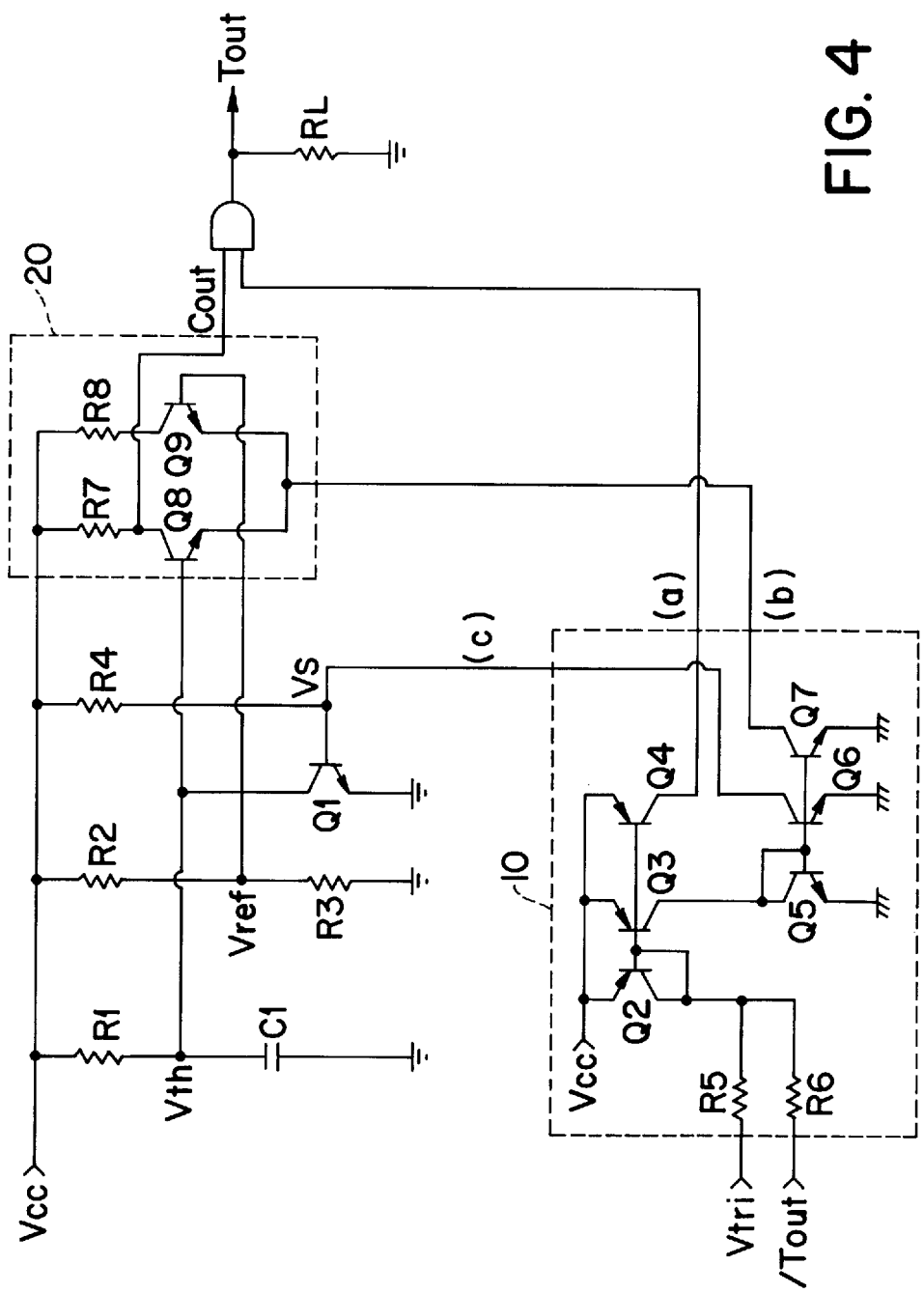
FIG. 4 shows a circuit diagram of a pulse generator according to the present invention.

The detailed circuit of the pulse generator according to the present invention is illustrated in FIG. 4.

As shown in FIG. 4, a resistor R1 and a capacitor C1 are connected in series between a supply voltage Vcc and ground. Two resistors R2 and R3 are also connected in series between the supply voltage Vcc and ground. The collector of a transistor Q1 is connected to the node between the resistor R1 and capacitor C1, and the emitter of the transistor Q1 is grounded. A resistor R4 is connected between the supply voltage Vcc and the base of the transistor Q1. A bias control circuit 10 has two input terminals, Vtri and /Tout, and three output terminals (a), (b) and (c). The terminal (c) is connected to the node between the resistor R4 and the base of the translator Q1. The input terminal Vtri is connected to the collector of a transistor Q2 by way of a resistor R5, and the input terminal /Tout is connected to the collector of the transistor Q2 by way of a resistor R6. The supply voltage Vcc is commonly applied to each emitters of the transistors Q2, Q3 and Q4. Each bases of the transistors Q2, Q3 and Q4 are connected to one another. The collector of the transistor Q3 is connected to the collector of the transistor Q5, and the collector of the transistor Q4 serves at the output terminal (a). Each of the transistors Q2, Q3 and Q4 has the same characteristics, and the three transistors Q2, Q3 and Q4 form a current mirror. Each bases of the transistors Q5, Q6 and Q7 are connected to one another, and each emitters of the transistors Q5, Q6 and Q7 are grounded. The collector of the transistor Q6 serves as the output terminal (b). Each of the transistors Q5, Q6 and Q7 has the same characteristics, and the three transistors Q5, Q6 and Q7 form a current mirror. A comparator 20 has two resistors R7 and R8, and two transistors Q8 and Q9. The resistor R7 is connected between the supply voltage Vcc and the collector of the transistor Q8, and the resistor R8 is connected between the supply voltage Vcc and the collector of the transistor Q9. The base of the transistor Q8 is connected to the node between the resistor R1 and capacitor C1, the base of the transistor Q9 is connected to the node between the two resistors R2 and R3. The output terminal (b) of the bias control circuit 10 and the two emitters of the transistors Q8 and Q9 are commonly connected to one another. The collector voltage of the transistor Q8 serves as an output voltage Cout of the comparator 20, and the output voltage Cout is inputted to an AND gate, together with the voltage of the terminal (a) from the bias control circuit 10. A resistor R, with a grounded terminal is connected to the output terminal of the AND gate 30. The voltage in the node between the resistor R, and output terminal of the AND gate 30 serves as an output signal Tout. The inverted output signal /Tout inputted to the bias control circuit 10 is obtained from an inverter inverting the output signal Tout, and the inverter is not shown in FIG. 4 for simplicity.

In the following the operation of the pulse generator in FIG. 4 will be described with reference to FIGS. 5A to 5G.

Since a time delay between the circuit elements of the pulse generator in FIG. 4 is very small, the waveforms of FIGS. 5A to 5G and 6A to 6G take no notice of the time delay. Moreover, the waveform of the trigger input Vtri in FIGS. 5B and 6B assumes a low level state to be valid.

FIG. 5A shows the waveform of the inverted output signal Tout, FIG. 5B shows the waveform of the trigger input Vtri, FIG. 5C shows the waveform of the current flowing through the terminal (b) of the bias control circuit 10, FIG. 5D shows the waveforms of the threshold voltage Vth and the reference voltage Vref, FIG. 5F shows the waveform of the output signal Tout, and FIG. 5G shows the waveform of the base voltage Vs of the transistor Q1.

The time interval t1 in FIGS. 5A to 5G denotes the initial state of the operation. During the interval t1, the trigger input Vtri is high level, and the inverted output signal /Tout is also high level since the output signal Tout maintains low level during that interval t1. Since the transistor Q2 in the bias control circuit 10 in fact operates as a conventional diode due to the connection of base and collector, the transistor Q2 is turned on when the collector voltage is low level. On the contrary, the transistor Q2 is turned off when the collector voltage is high level. Accordingly, the transistor Q2 is turned off when all of the inverted output signal /Tout and the trigger input Vtri is high level. If the transistor Q2 is turned off, other transistors Q3 and Q4 forming a current mirror are also turned off. The off state of the transistor Q4 renders the voltage of the terminal (n) low level. Due to the off state of the transistor Q3, no current flows in the collector of the transistor Q5, and thus no current flows in each collectors of the transistors Q6 and Q7. By these reasons, no current flows in each terminals (b) and (c), as shown in FIG. 5C, the current flowing through the terminal (b) is low level. The waveform of the current flowing through the terminal (c) is not shown in FIGS. 5A to 5G, since the waveforms of the two currents are the same. Consequently, the bias control circuit 10 determines power saving mode during the time interval t3, provides low level voltage through the terminal (a), and cuts off the current paths on the terminals (b) and (c).

Since no current flows on the terminal (c), the supply voltage Vcc is applied to the base of the transistor Q1 by way of the resistor R4, and thus the transistor Q1 is turned on by the base voltage of high level shown in FIG. 5G. Due to the on state of the transistor Q1, the current flowing through the resistor R1 bypasses the capacitor C1, and the capacitor C1 is discharged. Accordingly, as shown in FIG. 5D, the voltage of the node between the resistor R1 and capacitor C1, which is hereinafter referred to as threshold voltage Vth, maintains low level. The two resistors R2 and R3 divide the supply voltage Vcc by a ratio of their resistances. The voltage of the node between the two resistors R2 and R3, which is hereinafter referred to as reference voltage Vref, is represented as [R3/(R2+R3)]Vcc. The comparator 20 does not operate in the power saving mode because no current is supplied through the terminal (b). By this reason, as shown in FIG. 5E, the output Cout of the comparator 20 maintains low level. Since the two inputs of the AND gate 30 are all low level, the AND gate 30 outputs low level, and thus the output signal Tout maintains low level. The power saving mode is maintained until any change of state may occur in the input signals Vtri and/Tout.

As shown in FIG. 5B, the bias control circuit 10 determines operating mode when the trigger input Vtri goes down to a low level. In FIGS. 5A to 5G the operating mode includes the time intervals t2 and t3. The low level of the trigger input Vtri turns on the transistor Q2, and the transistors Q3 and Q4 is turned on in succession. Under this condition, a current having a predetermined value flows on each collectors of the transistors Q2, Q3 and Q4, and each collector currents are the same. By the on state of the transistor Q4, a high level voltage is outputted to the input terminal of the AND gate 30 through terminal (a). Since the supply voltage Vcc is applied to the node between the case and collector in the transistor Q5 due to the on state of the transistor Q3, the transistor Q5 is turned on. The three transistors Q5, Q6 and Q7 are connected to operate as a current mirror, and thus the collector current of the transistor Q5 is mirrored to each collector of the transistors Q6 and Q7. As shown in FIG. 5B, the current on the terminal (b) has a predetermined value, and the current on the terminal (c) is the same as that of the terminal (b). As soon as the current flows on the terminal (c), as shown in FIG. 5G, the base voltage Vs drops rapidly and the transistor Q1 is turned off by the low level of the base voltage Vs. Due to the off state of the transistor Q1, the capacitor C1 starts charging, and thus, as shown in FIG. 5D, the threshold voltage Vth rises. The comparator 20 operates normally by the current on the terminal (b). The comparator 20 of the present invention uses a conventional differential amplifier, but the scope and range of this invention is not restricted to the above embodiment. The transistor Q8 produces a collector current having a value which corresponds to the threshold voltage inputted its base, and the transistor Q9 produces a collector current having a value which corresponds to the reference voltage inputted its base. In the time interval t2, the reference voltage Vref is larger than the threshold voltage Vth and thus the collector current of the transistor Q9 is larger than the collector current of the transistor Q8 when the two transistors Q8 and Q9 are the same. If it is assumed that the resistances of the two resistors R7 and R8 are the same, the output Cout of the comparator 20 maintains high level in this interval t2 because the voltage drop by the resistor R7 is smaller than the voltage drop by the resistor R8. As described previously, the bias control circuit 10 also provides a high level voltage with the AND gate 30 through the terminal (a) during this interval t2, so the AND gate 30 outputs a high level. Accordingly, as shown in FIG. 5F, the output signal Tour maintains a high level in the interval t2.

If the capacitor C1 is charged continuously, the threshold voltage Vth rises to the reference voltage Vref. If the threshold voltage Vth coincide with the reference voltage Vref, the two voltage drops by the resistors R7 and R8 become same because the two collector currents of the transistors Q8 and Q9 are equal. As shown in FIG. 5E, at the boundary point between the two intervals t2 and t3, the comparator 20 outputs a low level, and thus the output signal Tout also drops to a low level.

The time interval for the threshold voltage Vth to reach the reference voltage Vref, t2 can be expressed as follow.

$$T2 = R1 * C1 * \ln\{Vcc/(Vcc-Vref)\}$$

From the above equation, it can be known that the time interval t2 is determined by the resistance of the resistor R1 and the capacitance of the capacitor C1. Since the time interval t2 determines the width of the output signal Tout. A circuit designer can control the width of the output signal Tout by selecting the resistance and capacitance of the resistor R1 and capacitor C1.

Even if the interval t2 comes to an end, the bias control circuit continues to determine the operating mode due to the low level of the trigger input Vtri, and provides the same output as in the interval t2.

When the trigger input Vtri goes to a high level in the interval t3, the bias control circuit 10 determines a power saving mode, so that the interval t4 starts. As described above, during the power saving mode no current flows on the terminals (b) and (c), and the voltage of the terminal (a) goes down to a low level. The comparator 20 does not operate and the output Cout also goes down to a low level since no current is supplied through the terminal (b). As shown in FIG. 5G, the base voltage Vs rises to a high level due to no current flows on the terminal (c). The high level of the base voltage Vs turns on the transistor Q1, and thus the capacitor C1 is discharged.

As a result, the bias control circuit 10 determines the power saving mode or operating mode in accordance with the trigger input Vtri and the inverted output signal/Tout. The pulse generator of the present invention enable the comparator 20 not to consume power during the power saving mode.

FIGS. 6A to 6G show waveforms of signals implemented in the pulse generator of FIG. 4 when the pulse width of the trigger input is smaller than that of the desired output signal.

Figure 6A:
Figure 6B:
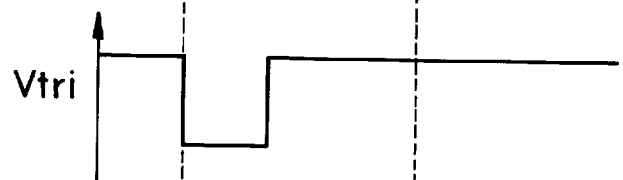
Figure 6C:
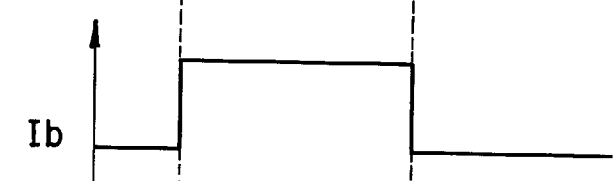
Figure 6D:
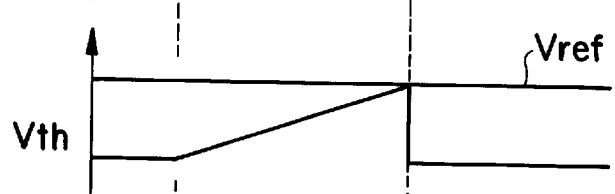
Figure 6E:
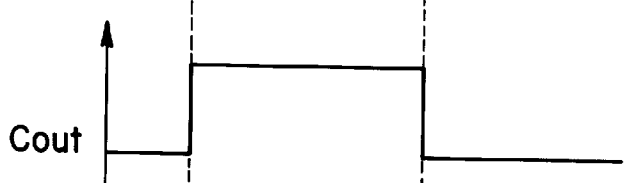
Figure 6F:
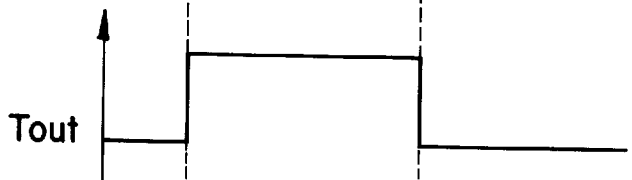
Figure 6G:
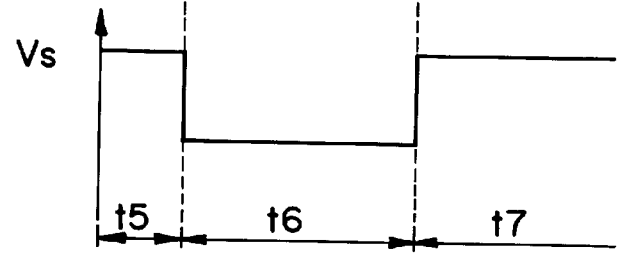

FIG. 6A shows the waveform of the inverted output signal/Tout, FIG. 6B shows the waveform of the trigger input Vtri, FIG. 6C shows the waveform of the current flowing through the terminal (b) of the bias control circuit 10, FIG. 6D shows the waveforms of the threshold voltage Vth and the reference voltage Vref. FIG. 6F shows the waveform of the output signal Tout, and FIG. 6G shows the waveform of the base voltage Vs of the transistor Q1.

The time interval t5 in FIGS. 6A to 6G denotes the initial state of the operation. During the interval t5, the trigger input Vtri is high level, and the inverted output signal/Tout is also high level since the output signal Tout maintains low level during this interval t5. In these circumstances, the bias control circuit 10 determines a power saving mode, and the operation of the pulse generator during the interval t5 is the same as during the interval t1 in FIGS. 5A to 5G. Therefore, detailed description on the pulse generator during that interval t5 is not referred to.

When the trigger input Vtri goes down to a low level, the bias control circuit 10 determines operating mode, so that the interval t6 starts. As shown in FIG. 6C, the bias control circuit 10 enables a predetermined current to flow on the terminals (b) and (c), and provides a low level voltage with the AND gate 30 through the terminal (a). The current on the terminal (c) enables the base voltage Vs to drop a low level, and thus the transistor Q1 is turned off, so that the capacitor C1 starts charging. Due to charging at capacitor C1, the threshold voltage Vth rises to the reference voltage Vref until the two voltages become the same. The comparator 20 compares the threshold voltage Vth with the reference voltage Vref and, as shown in FIG. 6E, outputs a high level as an output Cout when the reference voltage Vref is larger than the threshold voltage Vth. The AND gate 30 performs logical AND function of the output Cout and the output from the terminal (a), and outputs a high level during that interval t6. Although the trigger input Vtri rises to a high level in the interval t6, the inverted output signal/Tout maintains a low level since the output signal Tout maintains a high level due to the high level output Cout of the comparator 20. Accordingly, the bias control circuit 10 continues to determine the operating mode until the threshold voltage Vth may reach the reference voltage Vref. If the threshold voltage Vth and the reference voltage Vref become the same, the output Cout of the comparator 20 goes down to a low level and thus the output signal Tout also goes down to a low level. At this moment, the bias control circuit 10 determines a power saving mode since the inverted output signal/Tout rises to a high level and the trigger input Vtri maintains a high level. During the power saving mode, each of the currents on the terminals (b) and (c) is cut off, and the voltage of the terminal (a) goes down to a low level. In this case, the comparator 20 does not operate in absence of the current on the terminal (b), and the transistor Q1 is turned on by a high level of the base voltage Vs. Accordingly, the capacitor C1 is discharged, and thus, as shown in FIG. 6D, the threshold voltage Vth rapidly goes down to a low level.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

What is claimed is:

1. A pulse generator for generating output pulse of a predetermined width, comprising:

bias control means for determining one of a operating mode and power saving mode in accordance with a trigger input and an inverted version of the output signal, providing a control voltage of high level as well as forming a first and second current paths in the operating mode, and providing the control voltage of non-high level as well as cutting off the two current paths in the power saving mode;

an RC circuit having a resistor and capacitor connected in series between a supply voltage and ground, wherein said RC circuit provides a threshold voltage through the node between the resistor and the capacitor;

voltage dividing means for dividing the supply voltage by a predetermined ratio, and outputting the divided voltage as a reference voltage;

charge control means for causing the resistor to charge the capacitor of said RC circuit in response to the formation of the first current path and for discharging the capacitor in response to the cut-off of the first current path;

a comparator for comparing the threshold voltage with the reference voltage, to produce a predetermined output voltage in response to the result of the comparison, when the second current path is formed, and not operating when the second current path is cut off; and an AND gate for performing a logical AND function to the output voltage of said comparator and the control voltage of said bias control means, and providing the result of the AND function as an output signal.

2. The pulse generator according to claim 1, wherein the bias control means includes:

a first transistor having a base, an emitter and a collector, where the supply voltage is applied to the emitter, the trigger input and the inverted version of the output signal is commonly applied to the collector, and the base and the collector is connected to each other;

a second transistor having a base, an emitter and a collector, where the supply voltage is applied to the emitter and the base is connected to the base of said first transistor;

a third transistor having a base, an emitter and a collector, where the supply voltage is applied to the emitter, the base is connected to the base of said first transistor, and the collector voltage is provided with said AND gate as the control voltage;

a fourth transistor having a base, an emitter and a collector, where the emitter is grounded, the base is connected to the collector, and the collector is connected to the collector of said second transistor;

a fifth transistor having a base, an emitter and a collector, where the emitter is grounded, the base is connected to the base of said fourth transistor, and the collector serves as the first current path; and a sixth transistor having a base, an emitter and a collector, where the emitter is grounded, the base is connected to the base of said fourth transistor, and the collector serves as the second current path.

3. The pulse generator according to claim 2, wherein said charge control means includes:

a seventh transistor having a base, an emitter and a collector, where the emitter is grounded, the collector is connected to the node between the resistor and the capacitor of said RC circuit, the base is connected to the collector of said fifth transistor; and a resistor connected between the supply voltage and the base of said seventh transistor.

4. The pulse generator according to claim 3, wherein said comparator includes:

an eighth transistor having a base, an emitter and a collector, where the base is connected to the node between resistor and capacitor of said RC circuit, and the emitter is connected to the collector of said sixth transistor; and a ninth transistor having a base, an emitter and a collector, where the divided voltage is applied to the base, and the emitter is connected to the collector of said eighth transistor;

a first resistor connected between the supply voltage and the collector of said eighth transistor; and a second resistor connected between the supply voltage and the collector of said ninth transistor, wherein the collector voltage of said eighth transistor is provided to said AND gate as an output of said comparator.

5. The pulse generator according to claim 1, wherein the width of the output signal is determined by the resistance and the capacitance of the resistor and capacitor in said RC circuit.

* * * * *